(12) United States Patent
Morikawa

(10) Patent No.: US 11,097,907 B2
(45) Date of Patent: Aug. 24, 2021

(54) SUBSTRATE TRANSFER DEVICE AND SUBSTRATE TRANSFER METHOD

(71) Applicant: TOKYO ELECTRON LIMITED, Tokyo (JP)

(72) Inventor: Katsuhiro Morikawa, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/629,783

(22) PCT Filed: Jun. 26, 2018

(86) PCT No.: PCT/JP2018/024099
§ 371 (c)(1),
(2) Date: Jan. 9, 2020

(87) PCT Pub. No.: WO2019/012978
PCT Pub. Date: Jan. 17, 2019

(65) Prior Publication Data
US 2020/0172351 A1 Jun. 4, 2020

(30) Foreign Application Priority Data
Jul. 10, 2017 (JP) .............................. JP2017-134798

(51) Int. Cl.
*B65G 49/07* (2006.01)
*H01L 21/677* (2006.01)
*H01L 21/68* (2006.01)

(52) U.S. Cl.
CPC ............ *B65G 49/07* (2013.01); *H01L 21/677* (2013.01); *H01L 21/68* (2013.01)

(58) Field of Classification Search
CPC . H01L 21/677; H01L 21/68; H01L 21/67196; H01L 21/67178; H01L 21/67742; H01L 21/67173; B65G 49/07
See application file for complete search history.

(56) References Cited

U.S. PATENT DOCUMENTS

| 6,446,646 B1* | 9/2002 | Izumi ................ H01L 21/67017 134/134 |
| 10,103,043 B2* | 10/2018 | Choi .................. B01D 46/0045 |
| 10,388,547 B2* | 8/2019 | Holeyannavar ... H01L 21/67389 |
| 2010/0221895 A1* | 9/2010 | Seino ................ H01L 21/02532 438/478 |
| 2016/0169766 A1* | 6/2016 | Ishibashi .......... H01L 21/67253 73/40 |
| 2019/0267266 A1* | 8/2019 | Holeyannavar ... H01L 21/67201 |

(Continued)

FOREIGN PATENT DOCUMENTS

| JP | 9-330972 A | 12/1997 |
| JP | 2002-83854 A | 3/2002 |
| JP | 2003-92335 A | 3/2003 |

(Continued)

*Primary Examiner* — Kaitlin S Joerger
(74) *Attorney, Agent, or Firm* — Nath, Goldberg & Meyer; Jerald L. Meyer; Tanya E. Harkins

(57) ABSTRACT

A substrate transfer device according to an embodiment includes: a holding part configured to hold a substrate having a pattern formed on a front surface thereof; and a supply part configured to supply an inert gas, which locally keeps the front surface of the substrate held by the holding part in a low oxygen state, to the front surface of the substrate.

13 Claims, 10 Drawing Sheets

(56) References Cited

U.S. PATENT DOCUMENTS

2020/0098606 A1\* 3/2020 Ishibashi ............. H01L 21/6773
2020/0135520 A1\* 4/2020 Reuter ................... B01D 53/40

FOREIGN PATENT DOCUMENTS

| JP | 2009-170740 A | 7/2009 |
| JP | 2014-22570 A | 2/2014 |
| JP | 2015-90940 A | 5/2015 |
| JP | 2016-72356 A | 5/2016 |

\* cited by examiner

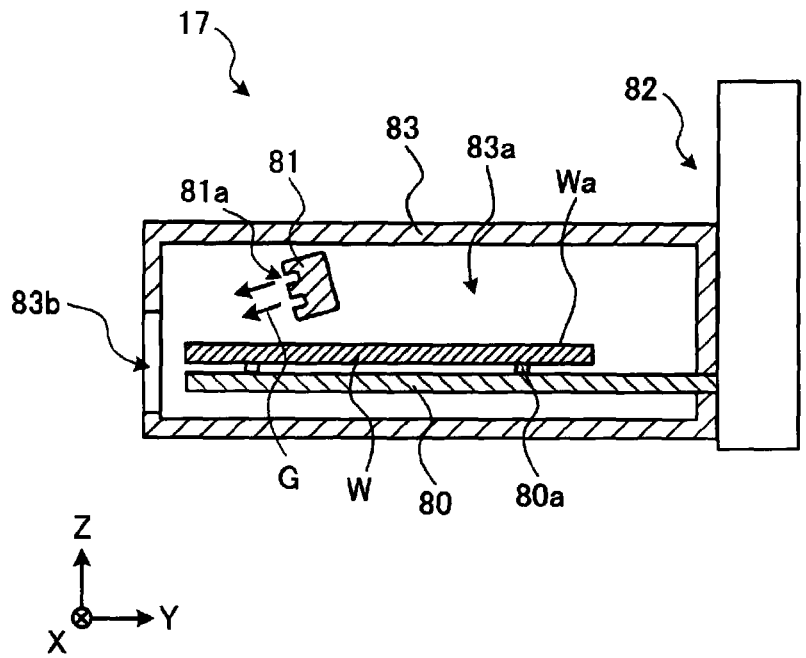
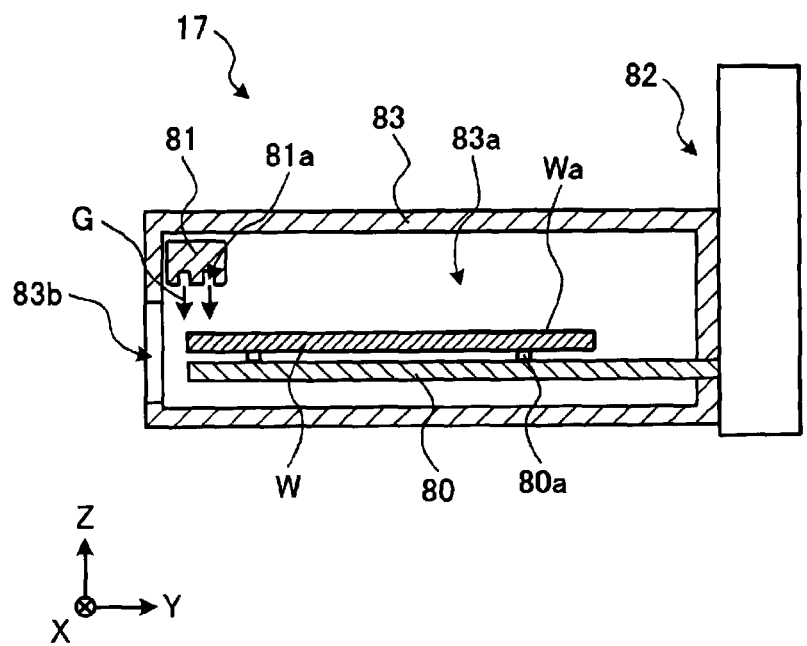

SUBSTRATE TRANSFER DEVICE AND SUBSTRATE TRANSFER METHOD

This is a National Phase Application filed under 35 U.S.C. 371 as a national stage of PCT/JP2018/024099, filed Jun. 26, 2018, an application claiming the benefit of Japanese Application No. 2017-134798, filed Jul. 10, 2017, the content of each of which is hereby incorporated by reference in its entirety.

TECHNICAL FIELD

The present disclosure relates to a substrate transfer device and a substrate transfer method.

BACKGROUND

In the related art, there has been known a substrate processing apparatus which includes a plurality of processing units arranged step-by-step to perform a predetermined substrate process on a substrate such as a semiconductor wafer or a glass substrate. In order to transfer the substrate to each processing unit, the substrate processing apparatus includes a substrate transfer device that transfers the substrate along the processing units arranged step-by-step.

PATENT DOCUMENTS

Patent Documents

Patent Document 1: Japanese Laid-Open Patent Publication No. 2014-22570

SUMMARY

The present disclosure provides a substrate transfer device and a substrate transfer method which are capable of suppressing a front surface of a substrate from being oxidized when the substrate is being transferred, without consuming a large amount of an inert gas.

A substrate transfer device according to an aspect of an embodiment includes: a holding part configured to hold a substrate having a pattern formed on a front surface thereof; and a supply part configured to supply an inert gas, which locally keeps the front surface of the substrate held by the holding part in a low oxygen state, to the front surface of the substrate.

According to the present disclosure, it is possible to suppress a front surface of a substrate from being oxidized when the substrate is being transferred, without consuming a large amount of an inert gas.

BRIEF DESCRIPTION OF DRAWINGS

FIG. 6 is a side cross-sectional view showing a schematic configuration of a substrate transfer device according to a first modification of the second embodiment.

FIG. 7 is a side cross-sectional view showing a schematic configuration of a substrate transfer device according to a second modification of the second embodiment.

DETAILED DESCRIPTION

Hereinafter, embodiments of a substrate transfer device and a substrate transfer method according to the present disclosure will be described in detail with reference to the accompanying drawings. The present disclosure is not limited to embodiments to be described hereafter.

In the related art, there has been known a substrate processing apparatus which includes a plurality of processing units arranged step-by-step to perform a predetermined substrate process on a substrate such as a semiconductor wafer or a glass substrate. In order to transfer the substrate to each processing unit, the substrate processing apparatus includes a substrate transfer device that transfers the substrate along the processing units arranged step-by-step.

However, in such a conventional substrate transfer device, in order to suppress a front surface of the substrate having patterns formed therein from being oxidized when the substrate is being transferred, it is necessarily required to fill the entire operation range of the substrate transfer device with an inert gas. Accordingly, there is a problem that a large amount of inert gas may be consumed.

Therefore, a demand exists for a technology for suppressing oxidation of a front surface of a substrate when the substrate is being transferred, without consuming a large amount of inert gas.

<Outline of Substrate Processing System>

Figure 1:
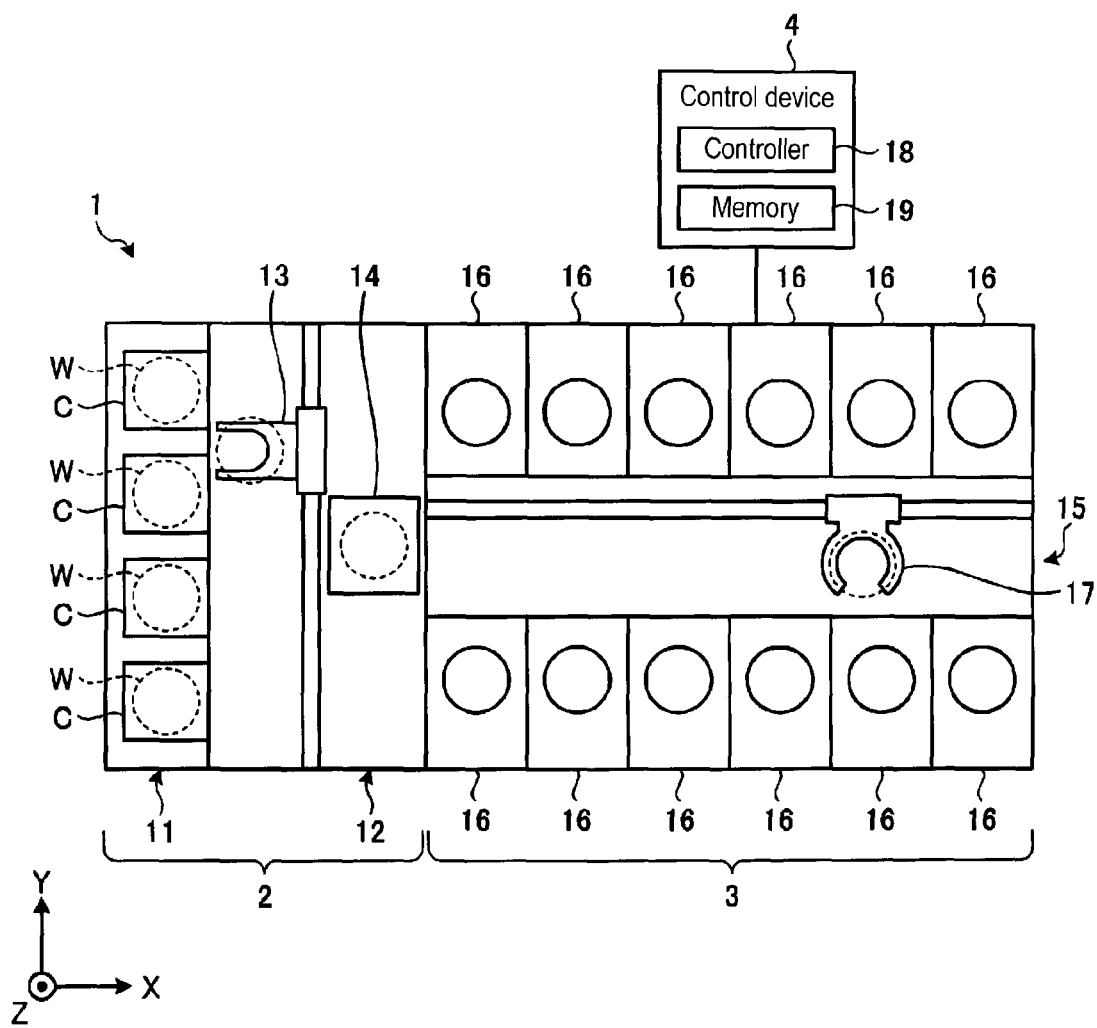
FIG. 1 is a view showing a schematic configuration of a substrate processing system according to a first embodiment.

First, a schematic configuration of a substrate processing system 1 according to a first embodiment will be described with reference to FIG. 1. FIG. 1 is a view showing the schematic configuration of the substrate processing system 1 according to the first embodiment. For the clarification of a positional relationship, an X-axis direction, a Y-axis direction and a Z-axis direction, which are orthogonal to one another, are defined in the following description, and a positive Z-axis direction is defined as a vertical upward direction.

As shown in FIG. 1, the substrate processing system 1 includes a loading/unloading station 2 and a processing station 3. The loading/unloading station 2 and the processing station 3 are provided adjacent to each other.

The loading/unloading station 2 includes a carrier stage 11 and a transfer part 12. A plurality of carriers C each accommodating horizontally a plurality of substrates, namely semiconductor wafers W (hereinafter, referred to as wafers W) in the first embodiment, is mounted on the carrier stage 11.

The transfer part 12 is provided adjacent to the carrier stage 11, and includes a substrate transfer device 13 and a delivery part 14 provided therein. The substrate transfer device 13 includes a wafer holding mechanism that holds the wafer W. The substrate transfer device 13 is movable in horizontal and vertical directions, and is rotatable about a vertical axis. The substrate transfer device 13 transfers the wafer W between the carrier C and the delivery part 14 using the wafer holding mechanism.

The processing station 3 is provided adjacent to the transfer part 12. The processing station 3 includes a transfer part 15 and a plurality of processing units 16. The plurality of processing units 16 is arranged in a step-by-step manner at both sides of the transfer part 15.

The transfer part 15 includes a substrate transfer device 17 provided therein. The substrate transfer device 17 includes a holding part 80 configured to hold the wafer W (see FIG. 3A). The substrate transfer device 17 is movable in horizontal and vertical directions, and is rotatable about a vertical axis. The substrate transfer device 17 transfers the wafer W between the delivery part 14 and each processing unit 16 using the holding part 80. Details of the substrate transfer device 17 will be described below.

The processing unit 16 performs a predetermined substrate process on the wafer W loaded thereinto by the substrate transfer device 17.

Further, the substrate processing system 1 includes a control device 4. The control device 4 may be a computer, and includes a controller 18 and a memory part 19. The memory part 19 stores a program for controlling various processes that are executed in the substrate processing system 1. The controller 18 controls the operation of the substrate processing system 1 by reading out and executing the program stored in the memory part 19.

In some embodiments, the program may be recorded in a computer-readable memory medium and may be installed on the memory part 19 of the control device 4 from the memory medium. Examples of the computer-readable memory medium may include a hard disk (HD), a flexible disk (FD), a compact disc (CD), a magneto-optical disk (MO), and a memory card.

In the substrate processing system 1 configured as above, first, the substrate transfer device 13 of the loading/unloading station 2 takes out the wafer W from the carrier C mounted on the carrier stage 11, and then mounts the taken-out wafer W on the delivery part 14. The wafer W mounted on the delivery part 14 is taken out from the delivery part 14 by the substrate transfer device 17 of the processing station 3, and then loaded into the processing unit 16.

The wafer W loaded into the processing unit 16 is processed by the respective processing unit 16, and subsequently, unloaded from the processing unit 16 by the substrate transfer device 17. Thereafter, the processed wafer W is mounted on the delivery part 14. The processed wafer W mounted on the delivery part 14 is returned to the carrier C of the carrier stage 11 by the substrate transfer device 13.

<Configuration of Processing Unit>

Figure 2:
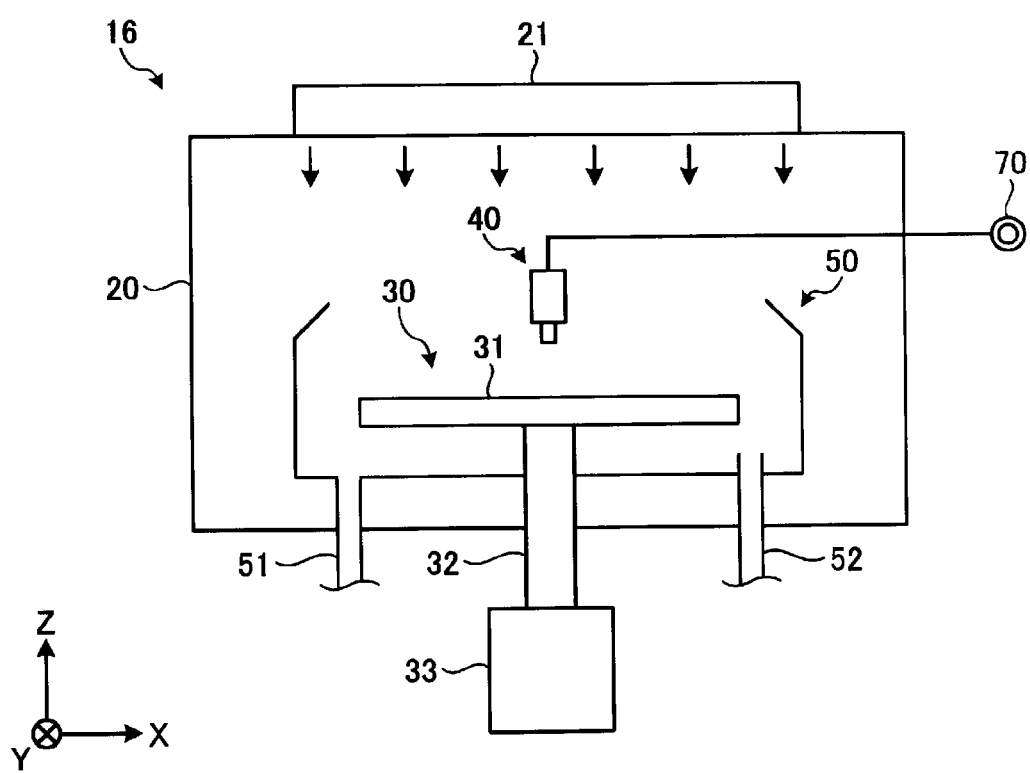
FIG. 2 is a schematic view showing a configuration of a processing unit.

Next, a configuration of the processing unit 16 will be described with reference to FIG. 2. FIG. 2 is a cross-sectional view showing a schematic configuration of the processing unit 16. As shown in FIG. 2, the processing unit 16 includes a chamber 20, a substrate holding mechanism 30, a processing liquid supply part 40, and a collection cup 50.

The chamber 20 accommodates the substrate holding mechanism 30, the processing liquid supply part 40, and the collection cup 50. A fan filter unit (FFU) 21 is disposed on a ceiling portion of the chamber 20. The FFU 21 forms a down-flow inside the chamber 20.

The substrate holding mechanism 30 includes a holding part 31, a supporting part 32, and a driving part 33. The holding part 31 holds the wafer W in a horizontal posture. The supporting part 32, which is a vertically-extending member, has a base end portion which is rotatably supported by the driving part 33 and a leading end portion which horizontally supports the holding part 31. The driving part 33 rotates the supporting part 32 about a vertical axis.

The substrate holding mechanism 30 rotates the holding part 31 supported by the supporting part 32 by rotating the supporting part 32 using the driving part 33, thereby rotating the wafer W held by the holding part 31.

The processing liquid supply part 40 supplies a processing liquid toward the wafer W. The processing liquid supply part 40 is connected to a processing liquid source 70.

The collection cup 50 is disposed to surround the holding part 31, and collects a processing liquid scattering from the wafer W with the rotation of the holding part 31. A drain port 51 is formed in a bottom of the collection cup 50. The processing liquid collected by the collection cup 50 is discharged outward of the processing unit 16 through the drain port 51. Further, an exhaust port 52 is formed in the bottom of the collection cup 50. A gas supplied from the FFU 21 is discharged outward of the processing unit 16 through the exhaust port 52.

<Configuration of Substrate Transfer Device (First Embodiment)>

Figure 3A:
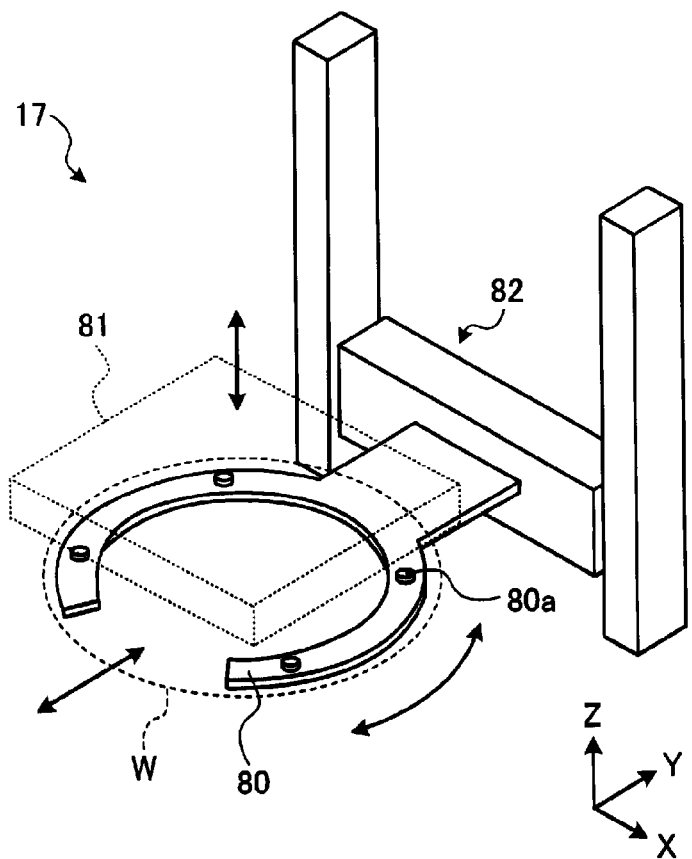
FIG. 3A is a perspective view showing a schematic configuration of a substrate transfer device according to the first embodiment.

Next, a configuration of the substrate transfer device 17 according to the first embodiment will be described with reference to FIGS. 3A and 3B. FIG. 3A is a perspective view showing a schematic configuration of the substrate transfer device 17 according to the first embodiment, and FIG. 3B is a side cross-sectional view showing the schematic configuration of the substrate transfer device 17 according to the first embodiment.

Figure 3B:
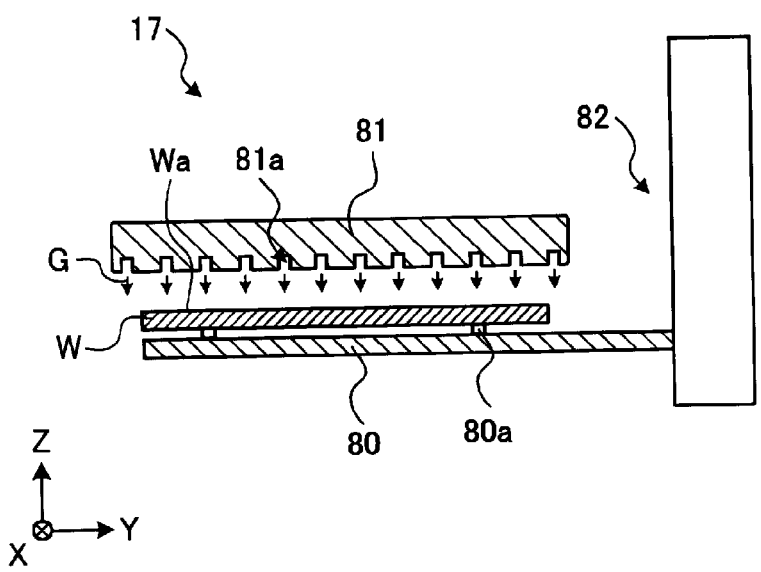
FIG. 3B is a side cross-sectional view showing the schematic configuration of the substrate transfer device according to the first embodiment.

As shown in FIGS. 3A and 3B, the substrate transfer device 17 according to the first embodiment includes a holding part 80, a supply part 81, and a moving mechanism 82. For easy of understanding, the supply part 81 and the wafer W are indicated by dashed lines in FIG. 3A.

As shown in FIG. 3A, the holding part 80 has a substantially C-shaped portion and is configured to hold the wafer W on an upper surface of the substantially C-shaped portion. Specifically, chuck mechanisms 80a are disposed on the upper surface of the substantially C-shaped portion of the holding part 80. The wafer W is held by the holding part 80 by operating the chuck mechanisms 80a. In the holding part 80, the shape of the portion that holds the wafer W is not limited to the substantial C-shape, but may be any shape as long as it can hold the wafer W.

As shown in FIG. 3B, the supply part 81 supplies an inert gas G (e.g., nitrogen, argon or the like) toward the front surface Wa of the wafer W. The inert gas G serves to locally keep a front surface Wa of the wafer W in a low oxygen state. For example, the supply part 81 is disposed near the front surface Wa of the wafer W to cover the front surface Wa. The supply part 81 has a plurality of discharge holes 81*a* formed in a surface facing the front surface Wa of the wafer W.

The inert gas G is supplied from the plurality of discharge holes 81*a* onto the entire front surface Wa of the wafer W in the form of a shower. The supply part 81 is connected to an inert gas source (not shown). The inert gas G is supplied from the inert gas source to the supply part 81.

The moving mechanism 82 is configured to move the holding part 80 and the supply part 81 in predetermined directions. For example, as shown in FIG. 3A, the moving mechanism 82 can move the holding part 80 in the horizontal direction (e.g., the Y-axis direction), and can rotate the holding part 80 about a vertical axis. Further, the moving mechanism 82 can move both the holding part 80 and the supply part 81 as a unit in the vertical direction.

In the substrate transfer device 17 according to the first embodiment, when the wafer W is transferred, the inert gas G is supplied from the supply part 81 onto the front surface Wa of the wafer W so that the front surface Wa of the wafer W is kept in a low oxygen state. Accordingly, it is possible to suppress the front surface Wa of the wafer W from being oxidized during the transfer.

Further, in the first embodiment, it is possible to locally keep the front surface Wa of the wafer W in a low oxygen state by supplying the inert gas G onto the front surface Wa from the supply part 81 disposed near the front surface Wa of the wafer W. Accordingly, it is possible to suppress consumption of the inert gas G, as compared with a case where the entire area of the transfer part 15 in which the substrate transfer device 17 is operated, is filled with the inert gas G.

That is to say, according to the first embodiment, it is possible to suppress the oxidation of the front surface Wa of the wafer W when the wafer W is being transferred, without consuming a large amount of inert gas G.

Further, in the first embodiment, by supplying the inert gas G from the plurality of discharge holes 81*a* onto the entire front surface Wa of the wafer W in the form of a shower, it is possible to substantially uniformly keep the entire front surface Wa of the wafer W in a low oxygen state. Therefore, according to the first embodiment, it is possible to substantially uniformly suppress the oxidation of the entire front surface Wa of the wafer W.

Figure 4:
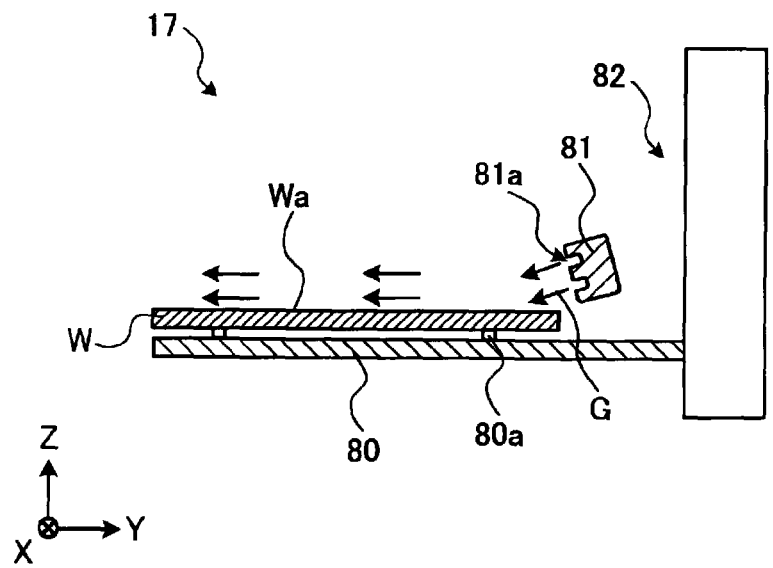
FIG. 4 is a side cross-sectional view showing a schematic configuration of a substrate transfer device according to a modification of the first embodiment.

The supply part 81 is not limited to the configuration in which the inert gas G is supplied from the plurality of discharge holes 81*a* onto the front surface Wa of the wafer W in the form of a shower. For example, as shown in FIG. 4, the supply part 81 may be disposed such that the inert gas G discharged from the supply part 81 flows on the front surface Wa of the wafer W. FIG. 4 is a side cross-sectional view showing a schematic configuration of a substrate transfer device 17 according to a modification of the first embodiment.

In this modification, for example, as shown in FIG. 4, the supply part 81 is disposed close to the peripheral portion of the wafer W held by the holding part 80, and the inert gas G is discharged from the discharge holes 81*a* of the supply part 81 toward the front surface Wa of the wafer W at a small angle. With this configuration, it is possible to supply the inert gas G such that the inert gas G flows along the front surface Wa of the wafer W, thus suppressing the oxidation of the front surface Wa of the wafer W during the transfer of the wafer W.

<Configuration of Substrate Transfer Device (Second Embodiment)>

Figure 5:
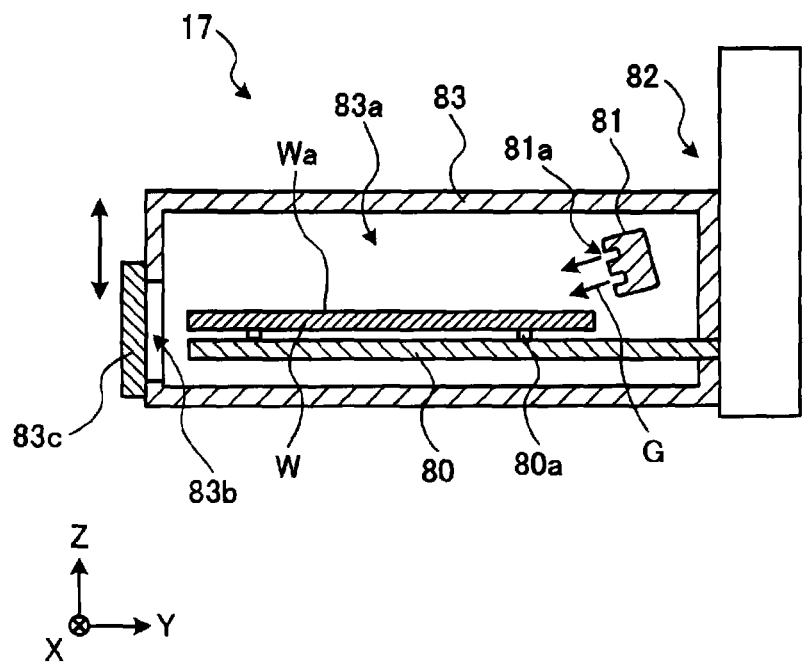
FIG. 5 is a side cross-sectional view showing a schematic configuration of a substrate transfer device according to a second embodiment.

Next, a configuration of a substrate transfer device 17 according to the second embodiment will be described with reference to FIG. 5. FIG. 5 is a side cross-sectional view showing a schematic configuration of the substrate transfer device 17 according to the second embodiment, which corresponds to FIG. 3B in the first embodiment. In the following description, the same components as those of the first embodiment described above will be designed by like reference numerals, and a duplicate description thereof will be omitted The substrate transfer device 17 according to the second embodiment further includes an accommodation part 83 in addition to the holding part 80, the supply part 81, and the moving mechanism 82. The accommodation part 83 has, for example, a box shape, and accommodates the holding part 80, the wafer W held by the holding part 80, and the supply part 81 in an internal space 83*a* defined therein.

The accommodation part 83 has a transfer port 83*b* formed therein. A shutter 83*c* for opening/closing the transfer port 83*b* is provided in the accommodation part 83. The holding part 80 can move outward of the accommodation part 83 through the transfer port 83*b* by the moving mechanism 82 in the state where the shutter 83*c* is opened, and can take the wafer W from the delivery part 14 or the processing unit 16. The holding part 80 loads the taken-out wafer W into the accommodation part 83.

Similarly, the holding part 80 can move the accommodated wafer W from the accommodation part 83 through the transfer port 83*b* in the state where the shutter 83*c* is opened, and can deliver the same to the delivery part 14 or the processing unit 16.

The moving mechanism 82 can integrally rotate both the accommodation part 83 and the holding part 80 about a vertical axis, and can integrally move the accommodation part 83, the holding part 80, and the supply part 81 in the vertical direction. Accordingly, the substrate transfer device 17 according to the second embodiment can arbitrarily select a direction in which the holding part 80 protrudes from the transfer port 83*b* or a height of the holding part 80.

In the second embodiment, it is possible to fill the internal space 83*a* of the accommodation part 83 with the inert gas G by supplying the inert gas G from the supply part 81. Accordingly, it is possible to substantially uniformly keep the entire front surface Wa of the wafer W in a low oxygen state when transferring the wafer W. Therefore, according to the second embodiment, it is possible to substantially uniformly suppress the oxidation of the entire front surface Wa of the wafer W.

Further, in the second embodiment, by closing the shutter 83*c* and forming a closed space around the wafer W by the accommodation part 83 and the shutter 83*c*, it is possible to keep the surrounding environment of the wafer W in a low oxygen state with a small amount of inert gas G. Therefore, in the second embodiment, the installation of the shutter 83*c* suppresses the oxidation of the front surface Wa of the wafer W during the transfer of the wafer W while further suppressing the consumption of the inert gas G. Further, in the case where the shutter 83*c* is provided, it is possible to fill the internal space 83*a* with the inert gas G regardless of the position of the supply part 81 in the internal space 83*a*.

Further, in the second embodiment, a small amount of inert gas G may be discharged from the supply part 81 even in a case where the wafer W is not accommodated in the accommodation part 83. That is, the amount of the inert gas G supplied from the supply part 81 when the wafer W is accommodated in the accommodation part 83 may be larger than that of inert gas G of the inert gas G supplied from the supply part 81 when the wafer W is not accommodated in the accommodation part 83. This makes it possible to continuously keep the internal space 83a in a low oxygen state, thus further suppressing the oxidation of the front surface Wa of the wafer W during the transfer of the wafer W.

<Various Modifications of Second Embodiment>

Next, various modifications of the second embodiment will be described with reference to FIGS. 6 to 8. FIG. 6 is a side cross-sectional view showing a schematic configuration of a substrate transfer device 17 according to a first modification of the second embodiment. In the substrate transfer device 17 according to the first modification, the shutter 83c is not provided and the transfer port 83b remains always opened.

Accordingly, as the shutter 83c is no longer necessary, it is therefore possible to suppress the oxidation of the front surface Wa of the wafer W during the transfer of the wafer W at low cost.

Further, in the first modification, as shown in FIG. 6, the supply part 81 may be disposed to discharge the inert gas G toward the transfer port 83b. This makes it possible to suppress an external atmosphere containing oxygen from flowing into the internal space 83a through the transfer port 83b. Therefore, according to the first modification, even if the transfer port 83b remains always open, it is possible to effectively fill the internal space 83a with the inert gas G, thus effectively suppressing the oxidation of the front surface Wa of the wafer W during the transfer of the wafer W.

FIG. 7 is a side cross-sectional view showing a schematic configuration of a substrate transfer device 17 according to a second modification of the second embodiment. As shown in FIG. 7, the supply part 81 may be disposed such that the inert gas G discharged from the supply part 81 functions as an air curtain that blocks the transfer port 83b. For example, the supply part 81 may be disposed higher than the vicinity of the transfer port 83b in the internal space 83a in a state where the discharge holes 81a are oriented downward, and the inert gas G may be discharged downward from the discharge holes 81a.

Accordingly, just as in the first modification, it is possible to suppress an external atmosphere containing oxygen from flowing into the internal space 83a through the transfer port 83b. Therefore, according to the second modification, even if the transfer port 83b remains always opened, it is possible to effectively fill the internal space 83a with the inert gas G, thus effectively suppressing the oxidation of the front surface Wa of the wafer W during the transfer of the wafer W.

Figure 8:
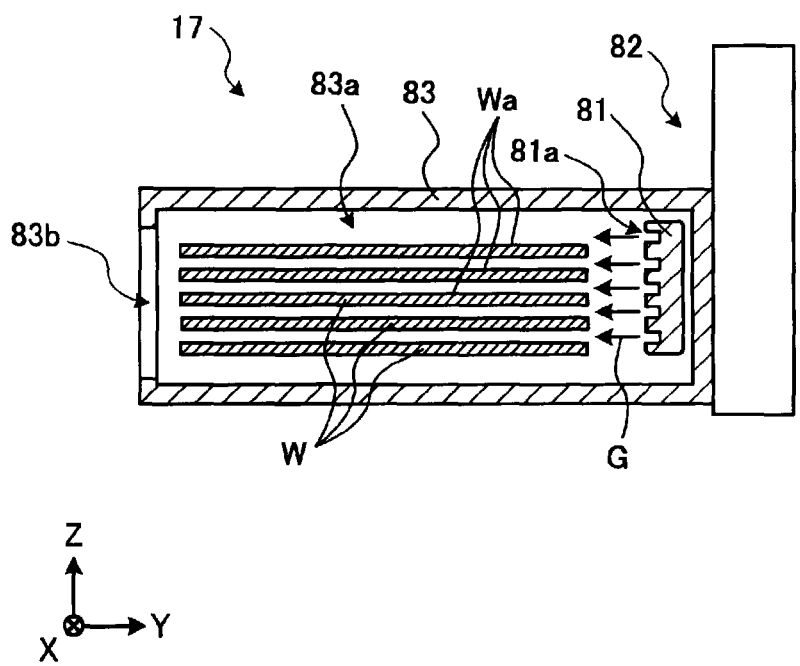
FIG. 8 is a side cross-sectional view showing a schematic configuration of a substrate transfer device according to a third modification of the second embodiment.

FIG. 8 is a side cross-sectional view showing a schematic configuration of a substrate transfer device 17 according to a third modification of the second embodiment. Unlike the substrate transfer devices 17 described thus far, the substrate transfer device 17 according to the third modification is a batch-type substrate transfer device configured to transfer a plurality of wafers W in a collective manner. In the third modification, the plurality of wafers W is accommodated in the accommodation part 83 by a holding part 80 (not shown) in a state where the plurality of wafers W is stacked one above another at predetermined intervals on the holding part 80.

In the third modification, the supply part 81 may be disposed to face the transfer port 83b with the stacked wafers W arranged between the supply part 81 and the transfer port 83b. The discharge holes 81a may be disposed toward the transfer port 83b, and the inert gas G may be discharged from the discharge holes 81a so as to flow on the front surfaces Wa of the wafers W.

Accordingly, it is possible to keep the front surface Wa of each wafer W in a low oxygen state using the inert gas G. Further, by the inert gas G discharged toward the transfer port 83b, it is possible to suppress an external atmosphere source containing oxygen from flowing into the internal space 83a through the transfer port 83b. Therefore, according to the third modification, even in the batch-type substrate transfer device 17, it is possible to effectively suppress the oxidation of the front surfaces Wa of the wafers W during the transfer of the wafers W.

<Transfer Step Sequence>

Figure 9:
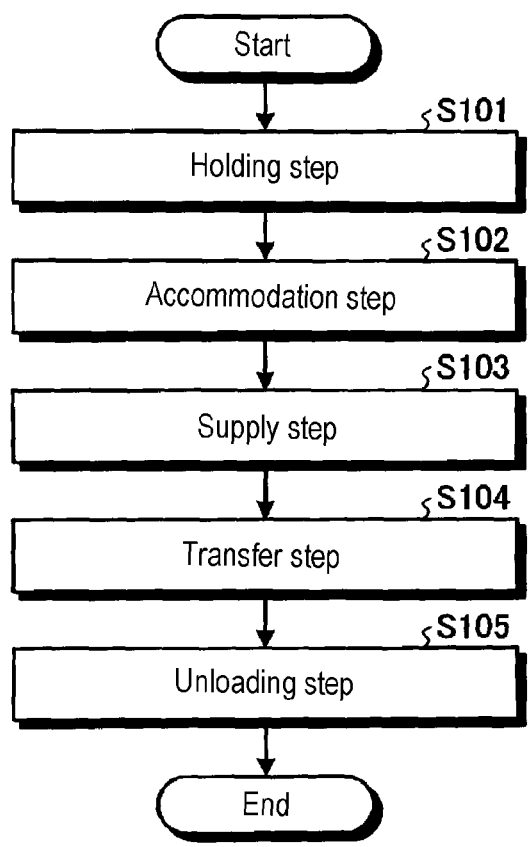
FIG. 9 is a flowchart showing a transfer step sequence performed by the substrate transfer device.

Next, a transfer step sequence performed by the substrate transfer device 17 will be described with reference to FIG. 9. FIG. 9 is a flowchart showing the transfer step sequence performed by the substrate transfer device 17.

As shown in FIG. 9, in the processing unit 16, a holding step is initially performed (step S101). In the holding step, the controller 18 controls the substrate transfer device 17 to move close to the wafer W to be transferred, controls the holding part 80 to move outward of the accommodation part 83, and controls the holding part 80 to hold the wafer W. In the case where the shutter 83c is provided in the accommodation part 83, the shutter 83c is opened before the holding part 80 moves outward of the accommodation part 83.

Subsequently, in the substrate transfer device 17, an accommodation step is performed (step S102). In the accommodation step, the controller 18 controls the holding part 80 to move to the interior of the accommodation part 83 so that the wafer W held by the holding part 80 is accommodated in the accommodation part 83. Further, in the case where the shutter 83c is provided in the accommodation part 83, the shutter 83c is closed after the wafer W is accommodated in the accommodation part 83.

Subsequently, in the substrate transfer device 17, a supply step is performed (step S103). In the supply step, the controller 18 controls the supply part 81 to discharge the inert gas G from the discharge holes 81a so that the inert gas G is supplied onto the front surface Wa of the wafer W. Accordingly, the front surface Wa of the wafer W can be kept in a low oxygen state.

Thereafter, in the substrate transfer device 17, a transfer step is performed (step S104). In the transfer step, the controller 18 controls the substrate transfer device 17 to transfer the wafer W close to a transfer destination of the wafer W while supplying the inert gas G to the front surface Wa of the wafer W.

Subsequently, in the substrate transfer device 17, an unloading step is performed (step S105). In the unloading step, the controller 18 controls the holding part 80 that holds the wafer W to move outward of the accommodation part 83, and to transfer the wafer W to the transfer destination. In the case where the shutter 83c is provided in the accommodation part 83, the shutter 83c is opened before the holding part 80 moves outward of the accommodation part 83. By completing such an unloading step, a series of transfer steps for one sheet of wafer W ends.

Figure 10:
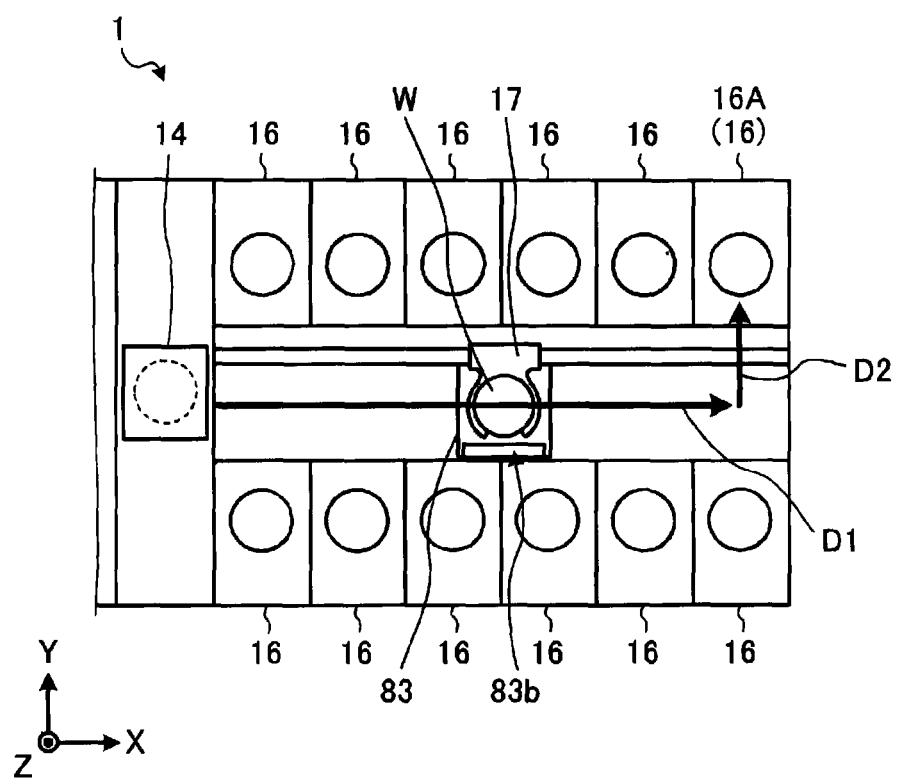
FIG. 10 is a schematic view showing a substrate transfer method according to a fourth modification of the second embodiment.

The transfer step (step S104) may be performed in a state where the transfer port 83b formed in the accommodation part 83 is oriented in a direction different from the movement direction of the wafer W. FIG. 10 is a schematic view showing a substrate transfer method according to a fourth modification of the second embodiment.

In FIG. 10, an example is illustrated in which the wafer W is transferred from the delivery part 14 to a processing unit 16A positioned at the left innermost side, among the plurality of processing units 16, when seen from the delivery part 14. In the example of FIG. 10, the wafer W is initially moved in a direction D1 as a positive X-axis direction and then moved in a direction D2 as a positive Y-axis direction.

In the fourth modification, the transfer port 83*b* formed in the accommodation part 83 may be oriented in a direction different from the direction D1 when the wafer W is moved in the direction D1, and may be oriented in a direction different from the direction D2 when the wafer W is moved in the direction D2.

With this configuration, it is possible to suppress an external atmosphere containing oxygen from flowing into the internal space 83*a* through the transfer port 83*b* when the wafer W is moved. Therefore, according to the fourth modification, even if the transfer port 83*b* remains always open, it is possible to fill the internal space 83*a* with the inert gas G, thus suppressing oxidation of the front surface Wa of the wafer W during the transfer of the wafer W.

As an example, as shown in FIG. 10, when the wafer W is moved in the direction D1, the transfer port 83*b* formed in the accommodation part 83 may be oriented in a negative Y-axis direction. That is, the movement direction of the wafer W and the orientation direction of the transfer port 83*b* may be in a substantially perpendicular relationship with each other. Accordingly, it is possible to effectively suppress an external atmosphere containing oxygen from flowing into the internal space 83*a* through the transfer port 83*b* during the movement of the wafer W.

However, the movement direction of the wafer W and the orientation direction of the transfer port 83*b* are not limited to be in the substantially perpendicular relationship, but may be set at any angle as long as it suppresses the flow of an external atmosphere into the internal space 83*a* through the transfer port 83*b*.

In the example of FIG. 10, the case where the wafer W is horizontally moved have been described. However, even in a case where the wafer W is vertically moved, the transfer port 83*b* formed in the accommodation part 83 may be oriented in a direction different from the vertical movement direction of the wafer W.

Figure 11A:
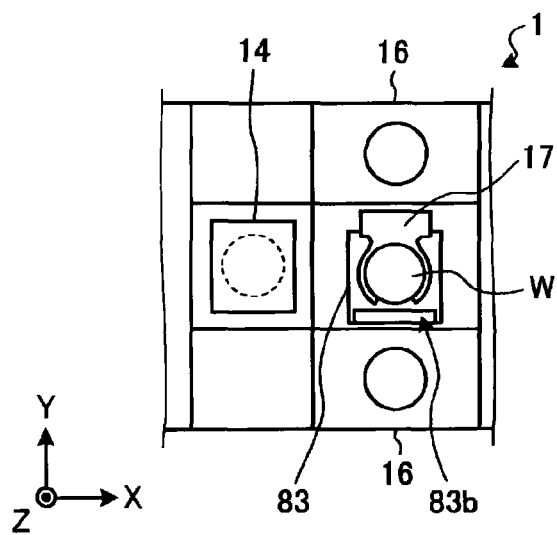
FIG. 11A is a top view showing a substrate processing system according to a fifth modification of the second embodiment.
Figure 11B:
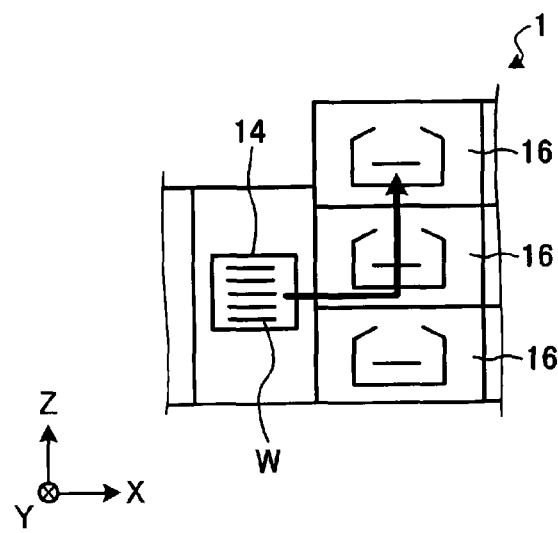
FIG. 11B is a side view showing the substrate processing system according to the fifth modification of the second embodiment.

FIG. 11A is a top view of a substrate processing system 1 according to a fifth modification of the second embodiment, and FIG. 11B is a side view of the substrate processing system 1 according to the fifth modification of the second embodiment. As shown in FIG. 11A, in the fifth modification, processing units 16 are disposed at both sides of the substrate transfer device 17, and a delivery part 14 is disposed at a side different from those of the processing units 16.

As shown in FIG. 11B, a plurality (three in FIG. 11B) of processing units 16 is provided to be stacked one above another. In this configuration, as shown in FIG. 11B, in a case where the wafer W is transferred from the delivery part 14 to the uppermost processing unit 16, the wafer W is moved in the vertical direction.

Figure 12:
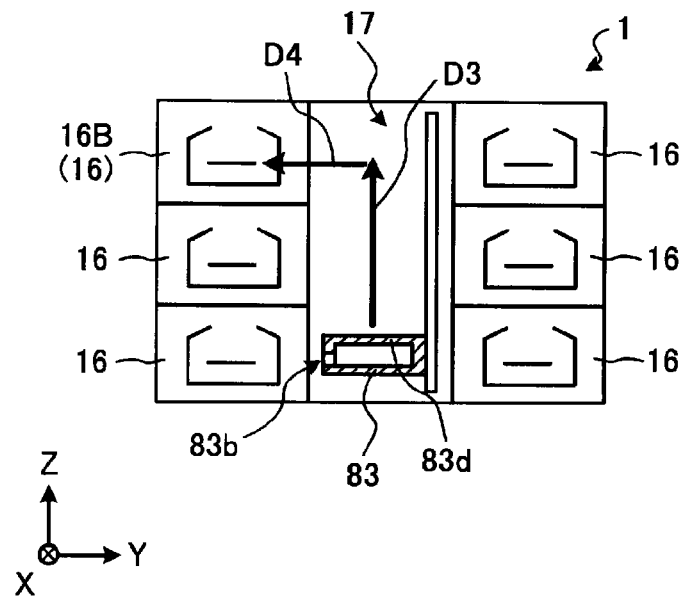
FIG. 12 is a schematic view showing a substrate transfer method according to the fifth modification of the second embodiment.

FIG. 12 is a schematic view showing a substrate transfer method according to the fifth modification of the second embodiment. In FIG. 12, an example is illustrated in which the wafer W is transferred to a processing unit 16B positioned at the top, among a plurality of processing units 16, in the negative Y-axis direction. In the example of FIG. 12, the wafer W is initially moved in a direction D3 as a positive Z-axis direction, and then moved in a direction D4 as the negative Y-axis direction.

In the fifth modification, the transfer port 83*b* formed in the accommodation part 83 may be oriented in a direction different from the direction D3 when the wafer W is moved in the direction D3, and may be oriented in a direction different from the direction D4 when the wafer W is moved in the direction D4.

With this configuration, it is possible to suppress an external atmosphere containing oxygen from flowing into the internal space 83*a* through the transfer port 83*b* when the wafer W is moved. Therefore, according to the fifth modification, even in the case where the transfer port 83*b* remains always opened, it is possible to fill the internal space 83*a* with the inert gas G, thus suppressing the oxidation of the front surface Wa of the wafer W during the transfer of the wafer W.

As an example, as shown in FIG. 12, when the wafer W is moved in the direction D3, the transfer port 83*b* formed in the accommodation part 83 may be oriented in the negative the Y-axis direction. Further, when the wafer W is moved in the direction D3, a cover 83*d* formed on the upper portion of the accommodation part 83 may be oriented in the direction D3. Accordingly, it is possible to effectively suppress an external atmosphere containing oxygen from flowing into the internal space 83*a* through the transfer port 83*b* when the wafer W is moved.

Figure 13:
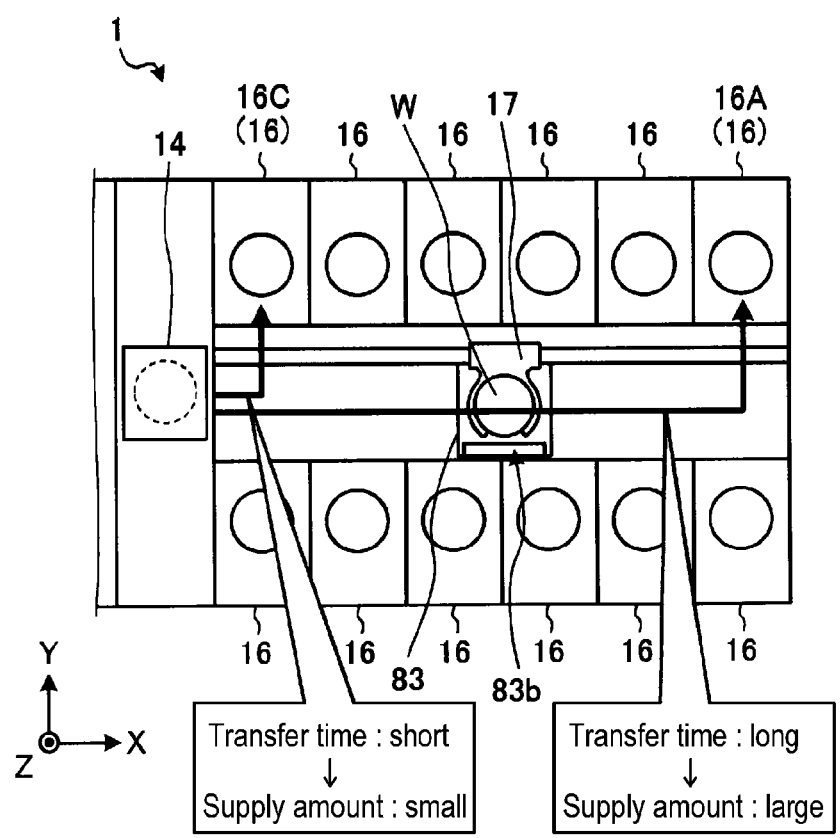
FIG. 13 is a schematic view showing a substrate transfer method according to a sixth modification of the second embodiment.

In the aforementioned supply step (step S103), the supply amount of the inert gas G may be controlled so that the degrees of oxidation of the plurality of wafers W are made uniform during the transfer of the wafers W based on transfer times of the plurality of wafers W that are individually transferred. FIG. 13 is a schematic view showing a substrate transfer method according to a sixth modification of the second embodiment.

In the example of FIG. 13, a transfer distance of the waver W from the delivery part 14 to the aforementioned processing unit 16A is longer than that of the wafer W from the delivery part 14 to a processing unit 16C which is positioned at the left front side when seen from the delivery part 14. Thus, the transfer of the waver W from the delivery part 14 to the processing unit 16A is longer in transfer time than the transfer of the waver W from the delivery part 14 to the processing unit 16C. Accordingly, assuming that the low oxygen states in the front surfaces Wa of the wafers W are identical to each other during the transfer of the wafers W, oxidization likely occurs when the wafer W is transferred to the processing unit 16A rather than when the wafer W is transferred to the processing unit 16C.

Accordingly, in the sixth modification, a relatively large amount of inert gas may be supplied in the case where the wafer W of which the transfer time is relatively long is transferred, as compared with the case where the wafer W of which the transfer time is relatively short is transferred. With this configuration, it is possible to make the oxidation degrees of the wafers W processed by the respective processing units 16 uniform regardless of the transfer times of the wafers W. Therefore, according to the sixth modification, the substrate processing system 1 including the plurality of processing units 16 can stably process the plurality of wafers W.

Further, in the sixth modification, a measuring instrument for measuring the amount of oxygen in the internal space 83*a* of the accommodation part 83 may be additionally provided. The supply amount of the inert gas G may be controlled based on the amount of oxygen in the internal space 83*a* obtained by the measuring instrument. Therefore, it is possible to more accurately make the oxidation degrees of the wafers W processed by the respective processing units 16 uniform.

Although various embodiments have been described, the present disclosure is not limited to the embodiments and may be changed in various ways without departing from the scope of the present disclosure. As an example, in the batch-type substrate transfer device 17 shown in FIG. 8, the shutter 83c may be disposed in the transfer port 83b. In some embodiments, the present disclosure may be applied to the substrate transfer device 13 instead of the substrate transfer device 17 in the substrate processing system 1.

The substrate transfer device according to the above embodiment includes the holding part 80 and the supply part 81. The holding part 80 holds the substrate (wafer W) having patterns formed on the front surface Wa thereof. The supply part 81 supplies the inert gas G, which locally keeps the front surface Wa of the substrate (wafer W) held by the holding part 80 in a low oxygen state, toward the front surface Wa of the substrate (wafer W). Accordingly, it is possible to suppress the oxidation of the front surface Wa of the wafer W during the transfer of the wafer W without consuming a large amount of inert gas G.

The substrate transfer device according to the above embodiment further includes the accommodation part 83 that accommodates the holding part 80, the supply part 81 and the substrate (wafer W) held by the holding part 80. The accommodation part 83 has the transfer port 83b through which the substrate (wafer W) is transferred into the accommodation part 83. Accordingly, it is possible to substantially uniformly suppress the oxidation of the entire front surface Wa of the wafer W.

In the substrate transfer device according to the above embodiment, the accommodation part 83 further includes the shutter 83c for opening/closing the transfer port 83b. Accordingly, it is possible to suppress the oxidation of the front surface Wa of the wafer W during the transfer of the wafer W while suppressing the amount of consumption of the inert gas G.

In the substrate transfer device according to the above embodiment, the supply part 81 discharges the inert gas G toward the transfer port 83b. Accordingly, even in the case where the transfer port 83b remains always opened, it is possible to effectively fill the internal space 83a with the inert gas G, thus effectively suppressing the oxidation of the front surface Wa of the wafer W during the transfer of the wafer W.

The substrate transfer device according to the above embodiment further includes the measuring instrument configured to measure the amount of oxygen inside the accommodation part 83. Based on the amount of oxygen in the accommodation part 83 obtained by the measuring instrument, the supply part 81 controls the supply amount of the inert gas G. Therefore, it is possible to more accurately make the oxidation degrees of the wafers W processed by the processing units 16 uniform.

Further, in the substrate transfer device according to the above embodiment, the supply part 81 supplies a relatively large amount of inert gas G in the case where the substrate (wafer W) is accommodated in the accommodation part 83, as compared with the case where the substrate (wafer W) is not in the accommodation part 83. Therefore, it is possible to continuously maintain the internal space 83a in a low oxygen state, and to further suppress the oxidation of the front surface Wa of the wafer W during the transfer of the wafer W.

The substrate transfer device according to the above embodiment further includes the moving mechanism 82 that moves the holding part 80 and the supply part 81 in predetermined directions. The moving mechanism 82 transfers the substrate (wafer W) in the state where the transfer port 83b is oriented in a direction different from the movement direction of the substrate (wafer W). Accordingly, it is possible to suppress an external atmosphere containing oxygen from flowing into the internal space 83a through the transfer port 83b when the wafer W is transferred.

In the substrate transfer device according to the above embodiment, the supply part 81 supplies the inert gas G toward the entire front surface Wa of the substrate (wafer W) in the form of a shower. Accordingly, it is possible to substantially uniformly suppress the oxidation of the entire front surface Wa of the wafer W during the transfer of the wafer W.

In the substrate transfer device according to the above embodiment, the supply part 81 supplies the inert gas G such that the inert gas G flows on the front surface Wa of the substrate (wafer W). Accordingly, it is possible to suppress the oxidation of the front surface Wa of the wafer W during the transfer of the wafer W.

The substrate transfer method according to the above embodiment includes the holding step (step S101), the supply step (step S103), and the transfer step (step S104). The holding step (step S101) holds the substrate (wafer W) having the patterns formed on the front surface Wa thereof. The supply step (step S103) supplies the inert gas G that locally keeps the front surface Wa of the substrate (wafer W) held by the holding part 80 in a low oxygen state, toward the front surface Wa of the substrate (wafer W). The transfer step (step S104) transfers the substrate (wafer W) while supplying the inert gas G toward the front surface Wa. Accordingly, it is possible to suppress the oxidation of the front surface Wa of the wafer W during the transfer of the wafer W without consuming a large amount of inert gas G.

In the substrate transfer method according to the above embodiment, the transfer step (step S104) causes the transfer port 83b formed in the accommodation part 83 which accommodates the substrate (wafer W), to be oriented in a direction different from the movement direction of the substrate (wafer W). Accordingly, it is possible to suppress an external atmosphere containing oxygen from flowing into the internal space 83a through the transfer port 83b when the wafer W is transferred.

In the substrate transfer method according to the embodiment, the supply step (step S103) controls the supply amount of the inert gas G so that the oxidation degrees of the plurality of substrates (wafers W) are made uniform during the transfer of the wafers W based on the transfer times of the plurality of substrates (wafers W) that are individually transferred. Therefore, in the substrate processing system 1 including the plurality of processing units 16, the wafers W can be stably processed.

It should be noted that the embodiments disclosed herein are exemplary in all respects and are not restrictive. Indeed, the above embodiments may be implemented in various ways. The above-described embodiments may be omitted, replaced or modified in various forms without departing from the scope and spirit of the appended claims.

EXPLANATION OF REFERENCE NUMERALS

W: wafer, Wa: front surface, G: inert gas, 1: substrate processing system, 16: processing unit, 17: substrate transfer device, 18: controller, 80: holding part, 81: supply part, 82: moving mechanism, 83: accommodation part, 83b: transfer port, 83c: shutter

What is claimed is:

1. A substrate transfer device comprising:
   a holding part configured to hold a substrate having a pattern formed on a front surface thereof;

a supply part configured to supply an inert gas, which locally keeps the front surface of the substrate held by the holding part in a low oxygen state, to the front surface of the substrate; and an accommodation part configured to accommodate the holding part, the supply part, and the substrate held by the holding part, the accommodation part including a transfer port through which the substrate is transferred into the accommodation part, wherein when the substrate is accommodated and transferred in the accommodation part, the supply part is configured to supply an amount of the inert gas that is larger than an amount of the inert gas when the substrate is not in the accommodation part.

2. The substrate transfer device of claim 1, wherein the accommodation part further includes a shutter configured to open/close the transfer port.

3. The substrate transfer device of claim 2, wherein the supply part is configured to discharge the inert gas toward the transfer port.

4. The substrate transfer device of claim 3, further comprising:

a measuring instrument configured to measure an amount of oxygen in the accommodation part, wherein the supply part is configured to control a supply amount of the inert gas based on the amount of oxygen in the accommodation part obtained by the measuring instrument.

5. The substrate transfer device of claim 1, further comprising: a moving mechanism configured to move the holding part and the supply part in a predetermined direction, wherein the moving mechanism transfers the substrate in a state where the transfer port is oriented in a direction different from a movement direction of the substrate.

6. The substrate transfer device of claim 5, wherein the supply part is configured to supply the inert gas toward the entire front surface of the substrate in a form of a shower.

7. The substrate transfer device of claim 5, wherein the supply part is configured to supply the inert gas such that the inert gas flows on the front surface of the substrate.

8. The substrate transfer device of claim 1, wherein the supply part is configured to discharge the inert gas toward the transfer port.

9. The substrate transfer device of claim 1, further comprising: a measuring instrument configured to measure an amount of oxygen in the accommodation part, wherein the supply part is configured to control a supply amount of the inert gas based on the amount of oxygen in the accommodation part obtained by the measuring instrument.

10. The substrate transfer device of claim 1, wherein the supply part is configured to supply the inert gas toward the entire front surface of the substrate in a form of a shower.

11. The substrate transfer device of claim 1, wherein the supply part is configured to supply the inert gas such that the inert gas flows on the front surface of the substrate.

12. A substrate transfer method comprising:

holding a substrate having a pattern formed on a front surface thereof;

supplying an inert gas, which locally keeps the front surface of the substrate in a low oxygen state, toward the front surface of the substrate; and transferring the substrate while supplying the inert gas toward the front surface of the substrate, wherein supplying the inert gas includes controlling a supply amount of the inert gas so that oxidation degrees of a plural number of the substrate are made uniform during the transfer of the substrates based on transfer times of the substrates which are individually transferred.

13. The substrate transfer method of claim 12, wherein the transferring is performed in a state where a transfer port formed in an accommodation part configured to accommodate the substrate is oriented in a direction different from a movement direction of the substrate.

* * * * *